(12) United States Patent
Yoon et al.

(10) Patent No.: US 10,459,263 B2
(45) Date of Patent: Oct. 29, 2019

(54) DISPLAY PANEL AND BORDERLESS TYPE DISPLAY INCLUDING THE SAME

(71) Applicant: LG DISPLAY CO., LTD., Seoul (KR)

(72) Inventors: Hyunmyoung Yoon, Chilgok-Gun (KR); Chulsang Shin, Paju-si (KR); Taehwa Shin, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 113 days.

(21) Appl. No.: 15/718,871

(22) Filed: Sep. 28, 2017

(65) Prior Publication Data

US 2018/0095315 A1  Apr. 5, 2018

(30) Foreign Application Priority Data

Sep. 30, 2016 (KR) .......................... 10-2016-0126781

(51) Int. Cl.
*G02F 1/133* (2006.01)
*G02F 1/1335* (2006.01)
*G02F 1/1368* (2006.01)
*H01L 27/12* (2006.01)

(52) U.S. Cl.
CPC ........ *G02F 1/13306* (2013.01); *G02F 1/1368* (2013.01); *G02F 1/133512* (2013.01); *H01L 27/1225* (2013.01); *G02F 2201/121* (2013.01); *G02F 2201/123* (2013.01); *G02F 2202/10* (2013.01)

(58) Field of Classification Search
CPC ........... G02F 1/13306; G02F 1/133512; G02F 1/1368; G02F 2001/13685; G02F 2201/121; G02F 2201/123; G02F 2202/10; G09G 3/36; G09G 3/3677; G09G 2310/0286; H01L 27/1225
See application file for complete search history.

(56) References Cited

U.S. PATENT DOCUMENTS

| 2011/0025959 A1* | 2/2011 | Cho ................... G02F 1/133371 349/106 |
| 2015/0187313 A1* | 7/2015 | Lee ....................... G09G 3/3674 345/100 |
| 2018/0090398 A1* | 3/2018 | Park ...................... G02F 1/1309 |

FOREIGN PATENT DOCUMENTS

KR  10-2014-0129731 A  11/2014

* cited by examiner

*Primary Examiner* — Nelson M Rosario
(74) *Attorney, Agent, or Firm* — Birch, Stewart, Kolasch & Birch, LLP (57) ABSTRACT

Disclosed herein are a display panel capable of improving operational reliability of a gate driver and a borderless type display including the same. The display panel allows light to be incident on at least one gate TFT of a gate driver formed to have a GIP structure to prevent degradation of gate TFTs due to positive shift of threshold voltage of the gate TFTs and to prevent reduction in output current of the gate driver, thereby improving the operational reliability of the gate driver.

19 Claims, 7 Drawing Sheets

[FIG 1a]

Related Art

[FIG 1b]

Related Art

DISPLAY PANEL AND BORDERLESS TYPE DISPLAY INCLUDING THE SAME

CROSS-REFERENCE TO RELATED APPLICATIONS

This application claims the priority of Korean Patent Application No. 10-2016-0126781 filed on Sep. 30, 2016, in the Korean Intellectual Property Office, the disclosure of which is hereby incorporated by reference in its entirety into the present application.

BACKGROUND

1. Technical Field

The present invention relates to a display panel that can improve operational reliability of a gate driver, and a borderless type display including the same.

2. Description of the Related Art

Among various flat panel displays, liquid crystal displays are widely applied to laptops, televisions, tablets, monitors, smartphones, portable displays, and portable information devices due to excellent characteristics thereof, such as thin thickness, light weight, and low power consumption.

A liquid crystal display includes a liquid crystal panel, a backlight unit providing light to the liquid crystal panel, and a plurality of driver circuits driving the liquid crystal panel and the backlight unit. The plurality of driver circuits includes a gate driver circuit applying a gate signal to each gate line of the liquid crystal panel and a data driver circuit applying a data signal to each data line of the liquid crystal panel. The gate driver circuit is disposed in a gate in panel (GIP) manner in the liquid crystal panel and includes a plurality of stages composed of a plurality of thin film transistors (TFTs).

Figure 1A:
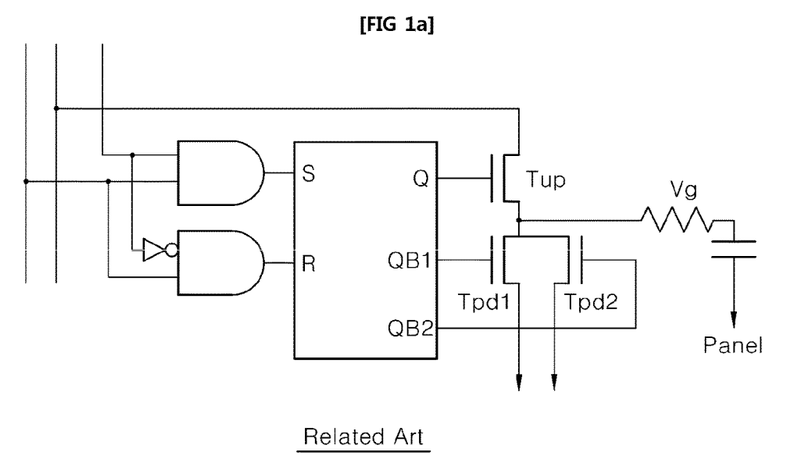
FIG. 1a is a schematic diagram of a stage of a general gate driver circuit according to a related art.
Figure 1B:
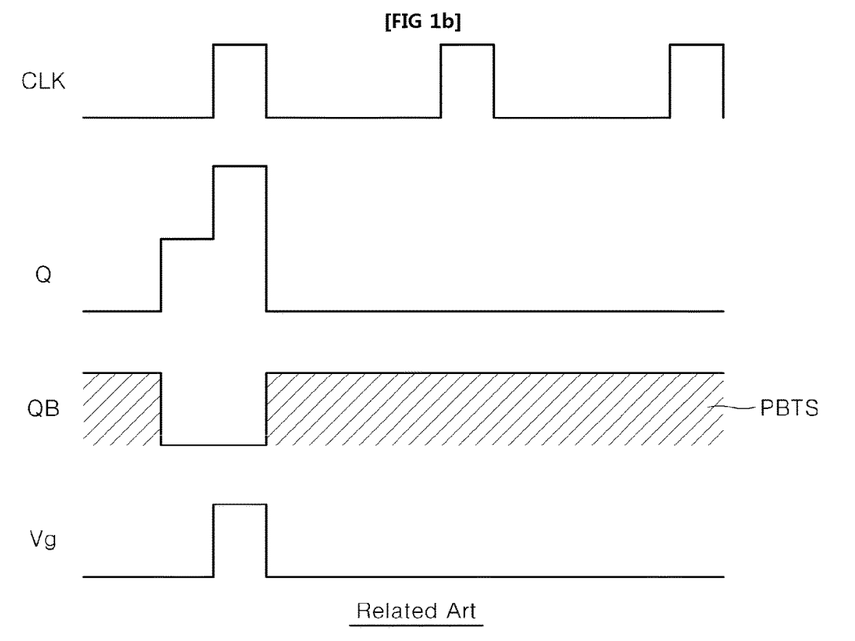

Referring to FIG. 1, each of the stages of the gate driver circuit according to a related art includes a Q node controlling a pull-up TFT Tup, a QB node controlling pull-down TFTs Tpd1, Tpd2, and a plurality of switch TFTs (not shown) charging the Q node while discharging the QB node or discharging the Q node while charging the QB node in response to external signals.

As shown in FIG. 1a, each of the stages of the gate driver circuit charges the Q node in response to a start signal and bootstraps potential of the Q node in response to a clock signal CLK to turn on the pull-up TFT Tup, thereby outputting a gate signal Vg. Then, each of the stages lowers potential of the Q node from a high level to a low level in response to a reset signal and maintains the potential at the low level for a predetermined period of time.

Here, the QB node of each of the stages is charged when the Q node is discharged and is discharged when the Q node is charged. In other words, at each stage, when the Q node has a high potential, the QB node has a low potential, and, when the Q node has a low potential, the QB node has a high potential.

As a result, at each stage, positive bias temperature stress PBTS is accumulated in TFTs switched depending on the potential of the QB node, for example, in the pull-down TFTs Tpd1, Tpd2 and some switches TFTs. The accumulated PBTS increases with increasing driving time of the liquid crystal display. As a result, the stressed TFTs are deteriorated, thereby causing the threshold voltage of the TFTs to be shifted in the positive (+) direction.

In order to address this problem, as shown in FIG. 1a, the general gate driver circuit alternately drives two pull-down TFTs Tpd1, Tpd2 respectively connected to two QB nodes QB1, QB2 of each of the stages to reduce deterioration of the TFTs.

Recently, in order to improve response of a liquid crystal display, oxide TFTs having higher electron mobility than amorphous silicon (a-Si:H) TFTs are used in a liquid crystal panel and a gate driver circuit However, the amount of negative shift of threshold voltage of an oxide TFT is much smaller than that of an amorphous silicon TFT. Thus, even when each of the stages of the gate driver circuit is composed of oxide TFTs, as shown in FIG. 1a, deterioration of the TFTs cannot be reduced, thereby causing the threshold voltage of the TFTs to be shifted in the positive (+) direction.

As a result, the magnitude of output current of each of the stages of the gate driver circuit is reduced due to accumulated PBTS, causing deterioration in reliability of the gate driver circuit.

BRIEF SUMMARY

It is one aspect of the present invention to provide a display panel which can improve operational reliability of a gate driver and a borderless type display including the same. Another aspect of the present invention is to provide a display panel including a gate driver, which addresses the limitations and disadvantages associated with the related art.

In accordance with one aspect of the present invention, a display panel includes a first substrate and a second substrate coupled to each other and a gate driver disposed on the first substrate.

The first substrate may include a display area in which a plurality of pixels is disposed and a non-display area surrounding the display area.

The gate driver may be disposed in the non-display area of the first substrate. The gate driver may include a plurality of gate TFTs.

The second substrate may be disposed under the first substrate and coupled to the first substrate with a liquid crystal layer interposed therebetween. The second substrate may include a black matrix corresponding to the gate driver disposed on the first substrate. The black matrix may include a light blocking region and a light transmitting region. The light transmitting region of the black matrix may correspond to at least one of the plurality of gate TFTs of the gate driver.

In accordance with another aspect of the present invention, a borderless type display includes a display panel and a backlight unit providing light to the display panel.

The display panel may include a first substrate having a gate driver disposed in a non-display area thereof and a second substrate including a black matrix corresponding to the gate driver, and may have a flip structure in which the second substrate is coupled to a lower side of the first substrate.

The black matrix may include a light blocking region and a light transmitting region. The light transmitting region of the black matrix may correspond to at least one of the plurality of gate TFTs of the gate driver. At least one gate TFT of the gate driver may receive light from the backlight unit through the light transmitting region of the black matrix.

One or more embodiments of the present invention provide a display panel which allows light to be incident on at least one gate TFT of a gate driver disposed to have a GIP structure in the display panel, thereby preventing the threshold voltage of the gate TFT from being shifted in the positive direction, and a borderless type display including the same.

According to the embodiment(s) of the present invention, the display panel can prevent deterioration of gate TFTs of each stage of the gate driver due to accumulated PBTS and thus can prevent reduction in output current, thereby improving operational reliability of the gate driver.

Further, the display panel according to the embodiment(s) of the present invention has a flip structure in which an array substrate is disposed on an upper side of a color filter substrate, thereby eliminating a need for a separate component concealing a pad formed in a non-display area of the array substrate and a soft film connected to the pad. Thus, the display according to the embodiment(s) of the present invention can be borderless at four sides (or any side) thereof, thereby improving external appearance.

BRIEF DESCRIPTION OF THE DRAWINGS

The above and other aspects, features, and advantages of the present invention will become apparent from the detailed description of the following embodiments in conjunction with the accompanying drawings, in which:

FIG. 1b is a diagram showing a general driving timing of the stage of FIG. 1a;

DETAILED DESCRIPTION OF THE EMBODIMENTS

Hereinafter, embodiments of the present invention will be described in detail with reference to the accompanying drawings.

Figure 2:
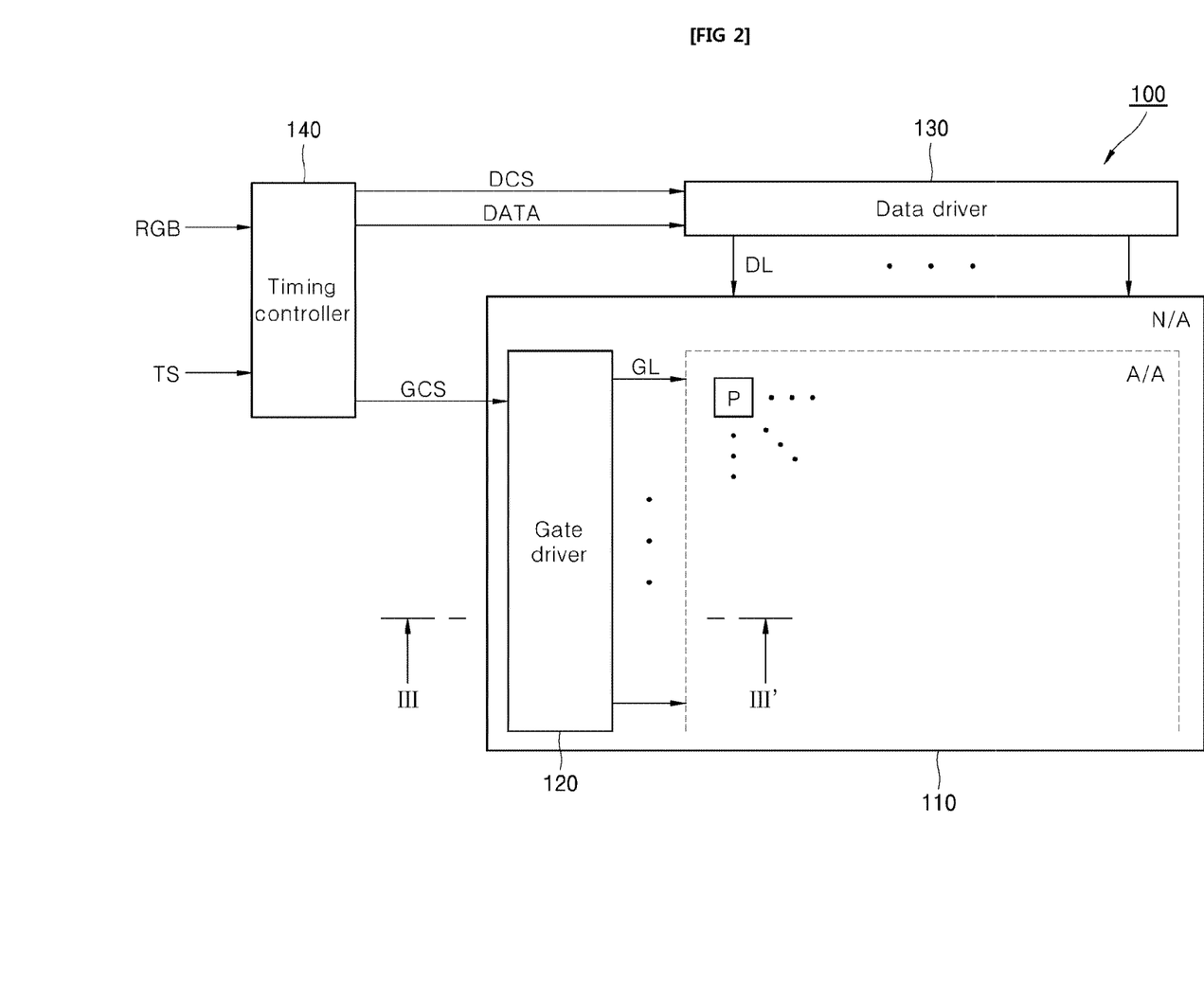
FIG. 2 is a diagram of a borderless type display according to one embodiment of the present invention.
Figure 3:
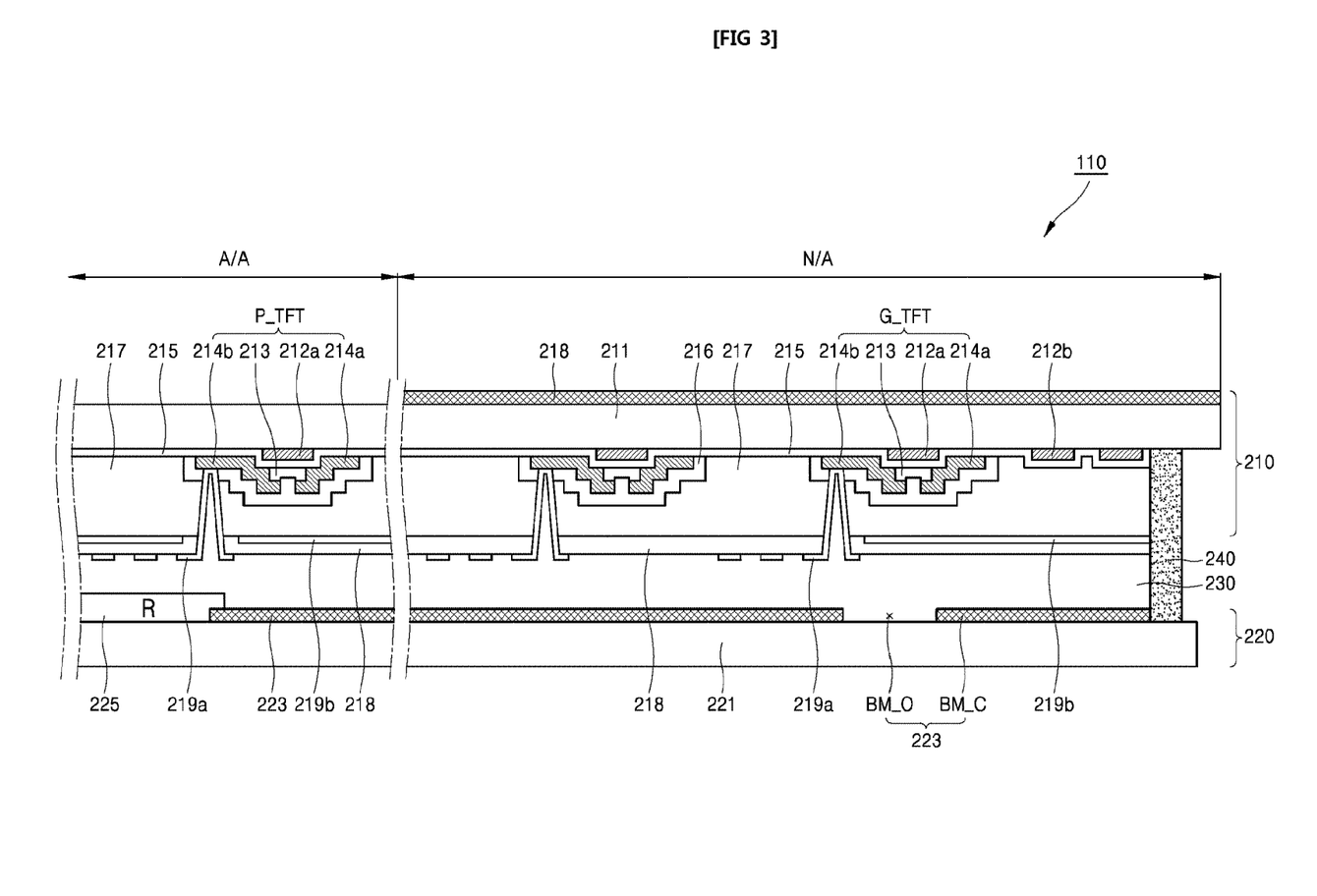
FIG. 3 is a sectional view taken along line III-III' of FIG. 2.

FIG. 2 is a diagram of a borderless type display according to one embodiment of the present invention and FIG. 3 is a sectional view taken along line III-III' of FIG. 2. All components of the borderless type display according to all embodiments of the present invention are operatively coupled and configured.

Referring to FIGS. 2 and 3, a borderless type display 100 according to this embodiment may include a display panel 110 and a plurality of driver circuits driving the display panel.

The display panel 110 may include a display area A/A and a plurality of non-display areas N/A surrounding the display area A/A. A plurality of pixels P may be disposed in the display area A/A of the display panel 110. A gate driver 120 may be disposed in at least one of the plurality of non-display areas N/A of the display panel 110. In addition, a pad connected to a flexible film may be formed in another non-display area N/A, in which the flexible film connects the display panel 110 to a printed circuit board (not shown), on which a timing controller 140 and the like are mounted.

As shown in FIG. 3, the display panel 110 may be a liquid crystal panel in which a first substrate, for example, an array substrate 210, is bonded to a second substrate, for example, a color filter substrate 220, with a liquid crystal layer 230 interposed therebetween. The array substrate 210 may be bonded to the color filter substrate 220 through a sealant 240 or the like. Here, the gate driver 120 may be disposed on the array substrate 210 in the non-display area N/A between the display area A/A and an area where the sealant 240 is disposed. The pad may be disposed on the array substrate 210 in the non-display area N/A outside the region in which the sealant 240 is disposed. In other words, the array substrate 210 of the display panel 110 may extend beyond the color filter substrate 220 at at least one side thereof since the pad is required to be disposed on the array substrate 210 in the non-display area N/A. The pad may be exposed to the outside.

Since the display 100 according to this embodiment is a borderless type display, the display panel 110 may have a flip structure.

A general display panel has a structure in which the array substrate is placed on a lower side of the color filter substrate. Conversely, the display panel 110 according to this embodiment may have an inverted structure in which the array substrate 210 formed with the pixels P, the gate driver 120 and the like is disposed on an upper side of the color filter substrate 220.

Accordingly, a backlight unit may be disposed on a back surface of the color filter substrate 220 to supply light to the display panel 110. In addition, the pad formed in the non-display area N/A of the array substrate 210 may be disposed in a backward direction of the display panel 110.

Thus, the display 100 according to this embodiment can eliminate a need to provide a separate component concealing the pad of the array substrate 210, such as a top case, and thus can be borderless at four sides thereof.

The array substrate 210 may include the plurality of pixels P and the gate driver 120 disposed on a dielectric substrate 211.

The plurality of pixels P may be disposed in the display area A/A of the array substrate 210. Each of the plurality of pixels P may be disposed in each area defined by a plurality of gate lines GL and a plurality of data lines DL crossing one another in the display area A/A. Each of the pixels P may include a thin film transistor connected to the gate line GL and the data line DL, for example, a pixel TFT P_TFT.

The pixel TFT P_TFT may include a gate electrode 212a connected to the gate line GL, a source electrode 214a connected to the data line DL, and a drain electrode 214b connected to a pixel electrode 219a through a contact hole (not shown). In addition, the pixel TFT P_TFT may include an active layer 213 which forms a conductive channel between the source electrode 214a and the drain electrode 214b through voltage supplied to the gate electrode 212a, for example, gate voltage.

The active layer 213 of the pixel TFT P_TFT may be formed of an oxide to increase response speed. That is, the pixel TFT P_TFT may be an oxide TFT including an oxide active layer 213. However, it should be understood that the present invention is not limited thereto and the active layer 213 of the pixel TFT P_TFT may be formed of any one of an amorphous silicon thin film, a polycrystalline silicon thin film, and an oxide semiconductor.

A gate insulating film 215 may be formed between the gate electrode 212a and the active layer 213 of the pixel TFT P_TFT. An interlayer insulating film 216 and a planarization film 217 may be sequentially formed on the source/drain electrodes 215a, 214b of the pixel TFT P_TFT. A protective film 218 may be formed on the planarization film 217.

The pixel electrode 219a may be formed on the protective film 218 to be connected to the drain electrode 214b of the pixel TFT P_TFT through the contact hole and may have a predetermined slit structure. In addition, a common electrode 219b may be formed on the planarization film 217 to generate a fringe field together with the pixel electrode 219a. The common electrode 219b may be formed in a single pattern over the entire surface of the planarization film 217 excluding the contact hole. However, it should be understood that the present invention is not limited thereto and the common electrode 219b may have a slit structure.

The pixel TFT P_TFT may be turned on in response to a gate signal supplied from the gate driver 120 through the gate line GL, that is, gate voltage, and supply a data signal supplied from the data driver DL through the data line DL, that is, data voltage, to the pixel electrode 219a. In addition, the pixel TFT may activate multiple liquid crystal molecules of the liquid crystal layer 230 through an electric field formed by the pixel electrode 219a and the common electrode 219b to control light transmittance, thereby displaying an image.

The color filter substrate 220 may include a color filter 225 and a black matrix 223 which are disposed on a dielectric substrate 221.

The color filter 225 may be disposed in the display area A/A of the color filter substrate 220. The color filter 225 may include a plurality of sub-color filters implementing red (R), green (G), and blue (B) colors.

The black matrix 223 may be disposed to separate the plurality of sub-color filters in the display area A/A of the color filter substrate 220 and to block light from the backside. The black matrix 223 may be disposed to correspond to the pixel TFT P_TFT of the array substrate 210. In addition, the black matrix 223 may be disposed in the non-display area N/A of the color filter substrate 220 to correspond to the gate driver 120 of the array substrate 210.

Although not shown in the drawings, a spacer is disposed on the pixel TFT P_TFT or the black matrix 223 in the display area A/A to maintain a distance between the array substrate 210 and the color filter substrate 220.

The plurality of driver circuits may include a timing controller 140, a data driver DL, and a gate driver 120. The gate driver 120 may be disposed in a gate in panel (GIP) manner in at least one non-display area N/A of the array substrate 210.

The timing controller 140 may generate a gate control signal GCS and a data control signal DCS in response to a timing signal TS supplied from an external system (not shown). The gate control signal GCS may be output to the gate driver 120 and the data control signal DCS may be output to the data driver 130.

In addition, the timing controller 140 may generate image data DATA by arranging image signals RGB input from the external system according to resolution of the display panel 110. The image data DATA may be output to the data driver 130 together with the data control signal DCS.

The data driver 130 may generate a data signal, that is, data voltage, from the image data DATA in response to the data control signal DCS supplied from the timing controller 140. The data voltage may be output to the pixels P in the display area A/A through the plurality of data lines DL of the display panel 110.

The gate driver 120 may generate a gate signal, that is, gate voltage, in response to the gate control signal GCS supplied from the timing controller 140. The gate voltage may be sequentially output to the pixels P in the display area A/A through the plurality of gate lines GL of the display panel 110. The gate driver 120 may be disposed in the non-display area N/A of the array substrate 210.

Figure 4:
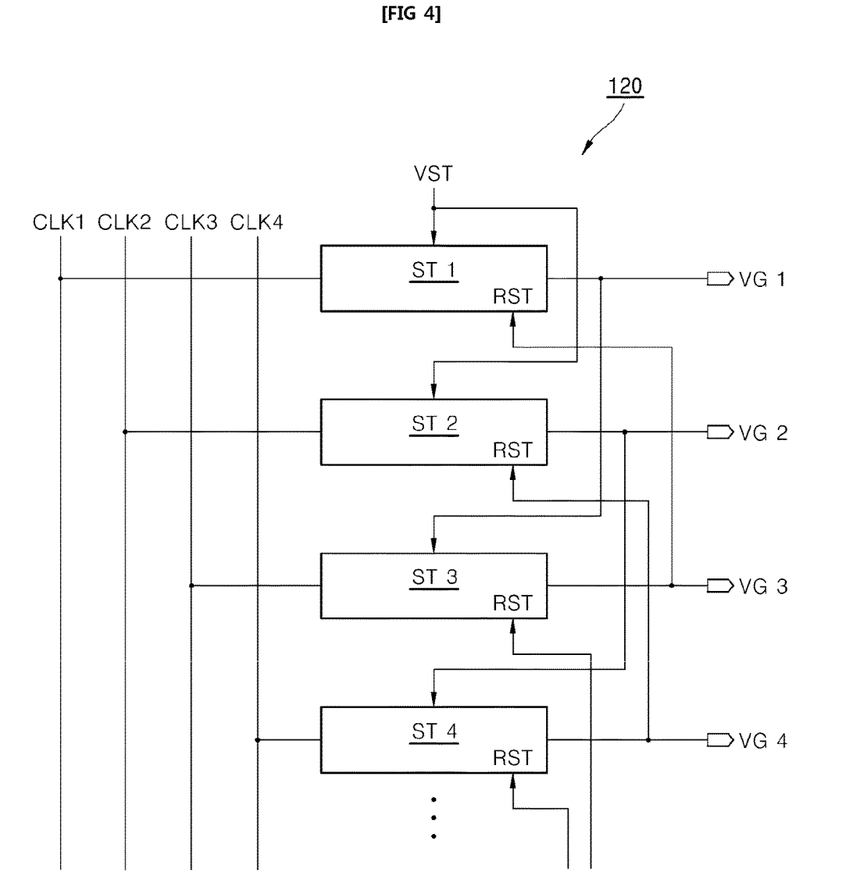
FIG. 4 is a diagram of an example of a gate driver of FIG. 2.

FIG. 4 is a diagram of an example of the gate driver 120 of FIG. 2.

Referring to FIGS. 3 and 4, the gate driver 120 may include a plurality of stages ST1 to ST4 generating and outputting gate voltages VG1 to VG4, respectively. Each of the stages ST1 to ST4 may include a plurality of thin film transistors, for example, a plurality of gate TFTs G_TFT.

The stages ST1 to ST4 of the gate driver 120 may output the plurality of gate voltages VG1 to VG4 sequentially phase-shifted through an output channel, respectively. The plurality of gate voltages VG1 to VG4 respectively output from the stages ST1 to ST4 may be output to the plurality of gate lines GL of the display area A/A, while being input as a start signal VST to one of rear stages and as a reset signal RST to one of front stages.

In other words, the start signal VST may be input from the timing controller 140 to the foremost two stages ST1, ST2 of the gate driver 120. On the other hand, the gate voltage output from the stage before the last stage may be input as the start signal VST to each of the remaining stages ST3, ST4 excluding the foremost two stages ST1, ST2. For example, the start signal VST output from the timing controller 140 may be input to the first stage ST1 of the gate driver 120. On the other hand, the first gate voltage VG1 output from the first stage ST1 may be input as the start signal VST to the third stage ST3 of the gate driver 120.

In addition, the gate voltage output from the stage after next may be input as the reset signal RST to each of the stages ST1 to ST4 of the gate driver 120. For example, the third gate voltage VG3 output from the third stage ST3 may be input as the reset signal RST to the first stage ST1 of the gate driver 120. On the other hand, to the rearmost two stages of the gate driver 120, the reset signal RST may be input from the timing controller 140, or the gate voltage output from a dummy stage may be input as the reset signal RST.

The plurality of gate TFTs G_TFT of each of the stages ST1 to ST4 of the gate driver 120 may be formed in the same process as the pixel TFT P_TFT described above. Thus, the gate TFT G_TFT may include a gate electrode 212a, an active layer 213, a source electrode 214a, and drain electrode 214b, in which the active layer 213 may be formed of an oxide. In addition, the gate TFT G_TFT may include a pixel electrode 219a connected to the drain electrode 214b through a contact hole and a common electrode 219b generating a fringe field together with the pixel electrode 219a. The gate TFT G_TFT differs from the pixel TFT P_TFT in that the gate electrode 212a and the source electrode 214a are connected to a plurality of signal lines 212b. Here, the plurality of signal lines 212b serves to transmit the gate control signal GCS to the gate TFT G_TFT and may be disposed in the same layer as the gate electrode 212a.

Further, a black tape 218 for defining a border of the display 100 may be attached to an upper surface of the array substrate 210 in the non-display area N/A, in which the gate driver 120 is disposed. Accordingly, the gate driver 120 and the pad are not visible from the front of the display panel.

A black matrix 223 may be disposed in the non-display area N/A of the color filter substrate 220 corresponding to the gate driver 120 disposed on the array substrate 210 to correspond to the gate driver 120 disposed in the non-display area N/A of the array substrate 210.

The black matrix 223 disposed in the non-display area N/A of the color filter substrate 220 may include a light blocking area BM_C and a light transmitting area BM_O. A gate TFT G_TFT of the gate driver 120 corresponding to the light blocking region BM_C of the black matrix 223 does not receive light from the back surface of the color filter substrate 220. Conversely, a gate TFT G_TFT of the gate driver 120 corresponding to the light transmitting region BM_O of the black matrix 223 receives light from the back surface of the color filter substrate 220.

As described above, in the display panel 110 according to this embodiment, the black matrix 223 disposed in the non-display area N/A of the color filter substrate 220 includes the light transmitting region BM_O such that light can be incident on at least one gate TFT G_TFT of the gate driver 120 corresponding to the light transmitting region BM_O, thereby improving operational reliability of the gate driver 120. This is based on the fact that the oxide forming a channel region of the gate TFT G_TFT, that is, the active layer 213, has light-induced negative bias stress (NBTS).

In other words, the gate TFT G_TFT receiving light through the light transmitting region BM_O of the black matrix 223 has a threshold voltage shifted in the negative (−) direction due to the aforementioned optical properties of the oxide forming the active layer 213. Accordingly, the gate driver 120 can prevent the threshold voltage of the plurality of gate TFTs G_TFT from being shifted in the positive (+) direction due to accumulated PBTS. As a result, it is possible to prevent deterioration of the gate TFT G_TFT of each of the stages ST1 to ST4 of the gate driver 120 and to prevent reduction in magnitude of output current, thereby improving operational reliability.

In addition, as described with reference to FIG. 3, the gate TFT G_TFT of the gate driver 120 corresponding to the light transmitting region BM_O of the black matrix 223 has substantially the same structure as the pixel TFT P_TFT. Thus, a predetermined electric field is generated between the pixel electrode 219a connected to the drain electrode 214b of the gate TFT G_TFT and the underlying common electrode 219b, thereby activating multiple liquid crystal molecules of the liquid crystal layer 230.

Accordingly, it is possible to control the behavior of the liquid crystal molecules of the liquid crystal layer 230 by regulating the magnitude of voltage applied to the pixel electrode 219a or voltage applied to the common electrode 219b. As a result, it is possible to control the amount of negative (−) shift of the threshold voltage of the gate TFT G_TFT by regulating the amount of light incident on the gate TFT G_TFT through the light transmitting region BM_O of the black matrix 223.

Since a gate TFT G_TFT of the gate driver 120 corresponding to the light blocking region BM_C of the black matrix 223 does not serve to activate the multiple liquid crystal molecules of the liquid crystal layer 230, the common electrode 219a for that gate TFT G_TFT may be omitted.

The light transmitting region BM_O of the black matrix 223 may correspond to at least one gate TFT G_TFT of each of the stages ST1 to ST4 of the gate driver 120, which is operated according to potential of a QB node.

Here, the light transmitting region BM_O of the black matrix 223 may be configured to correspond to the overall size of the gate TFT G_TFT corresponding thereto. Accordingly, sufficient light can be incident on the gate TFT G_TFT through the light transmitting region BM_O.

Alternatively, the light transmitting region BM_O of the black matrix 223 may be configured to correspond to the size of the active layer 213 of the gate TFT G_TFT corresponding thereto. Accordingly, light can be incident on the gate TFT G_TFT through the light transmitting region BM_O in a more concentrated manner. In other words, the light transmitting region BM_O corresponds to the active layer 213 of the gate TFT G_TFT such that light incident through the light transmitting region BM_O can be prevented from being reflected and scattered by the other electrodes of the gate TFT G_TFT, such as the source electrode 214a and the drain electrode 214.

Figure 5:
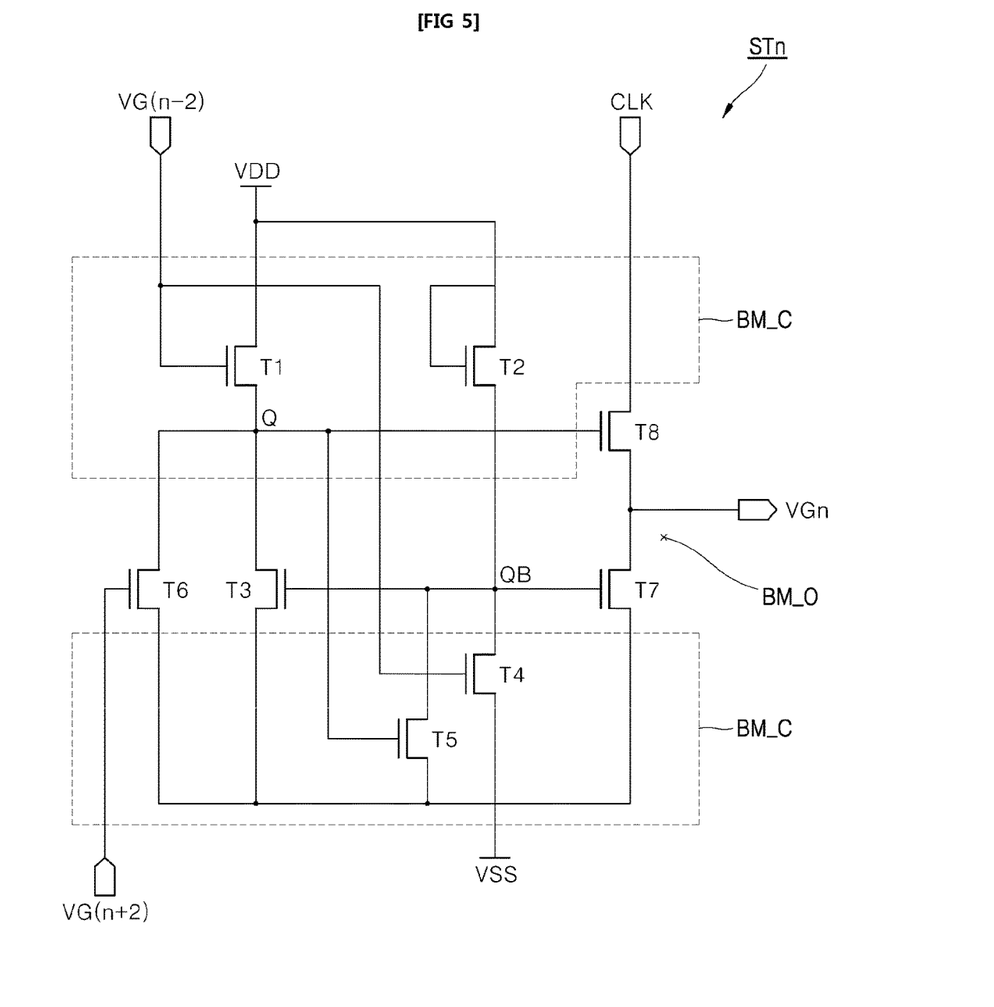
FIG. 5 is a diagram of an internal configuration of one of multiple stages of the gate driver of FIG. 4.

FIG. 5 is a diagram of an internal configuration of one of the multiple stages of the gate driver of FIG. 4.

Referring to FIG. 5, an Nth stage STn of the gate driver 120 may include first to eighth gate TFTs G_TFT1 to G_TFT8 generating and outputting an Nth gate voltage VGn according to signals supplied from the outside.

The first gate TFT G_TFT1 may supply a first source voltage VDD to a Q node in response to an (N−2)th gate voltage VG(n−2) output from the stage before the last stage, for example, an (N−2)th stage.

The second gate TFT G_TFT2 may supply the first source voltage VDD to a QB node.

The third gate TFT (G_TFT3) may control the voltage of the Q node in response to the voltage of the QB node.

The fourth gate TFT G_TFT4 may discharge the QB node in response to the (N−2)th gate voltage VG(n−2) output from the (N−2)th stage.

The fifth gate TFT G_TFT5 may discharge the QB node in response to the voltage of the Q node.

The sixth gate TFT G_TFT6 may discharge the Q node in response to an (N+2)th gate voltage VG(n+2) output from the stage after next, for example, an (N+2)th stage.

The seventh gate TFT G_TFT7 may discharge an output node in response to the voltage of the QB node.

The eighth gate TFT G_TFT8 may charge the output node in response to the voltage of the Q node, or may discharge the output node in response to the voltage of the QB node.

At least one of the first to eighth gate TFTs G_TFT1 to G_TFT8 of the Nth stage STn may correspond to the light transmitting region BM_O of the black matrix 223. For example, the third gate TFT G_TFT3, the sixth gate TFT G_TFT6, the seventh gate TFT G_TFT7, and the eighth gate TFT G_TFT8, which are operated according to the potential of the QB node of the Nth stage STn, may correspond to the light transmitting region BM_O of the black matrix 223. This is because the gate driver 120 is operated in such a way that the potential of the QB node is maintained at a high level for a relatively long time after the Q node of each of the stages is discharged.

However, it should be understood that the present invention is not limited thereto and only one gate TFT connected to the QB node of the Nth stage STn may correspond to the light transmitting region BM_O of the black matrix 223, or only a gate TFT directly connected to the QB node may correspond to the light transmitting region BM_O of the black matrix 223.

Remaining gate TFTs, excluding the third gate TFT G_TFT3, the sixth gate TFT G_TFT6, the seventh gate TFT G_TFT7 and the eighth gate TFT G_TFT8, may correspond to the light blocking region BM_C of the black matrix 223.

The light transmitting region BM_O of the black matrix 223 may be configured to correspond to the entirety or the active layer 213 of each of the third gate TFT G_TFT3, the sixth gate TFT G_TFT6, the seventh gate TFT G_TFT7 and the eighth gate TFT G_TFT8.

As described above, the third gate TFT G_TFT3, the sixth gate TFT G_TFT6, the seventh gate TFT G_TFT7, and the eighth gate TFT G_TFT8 of the Nth stage STn of the gate driver 120 may correspond to the light transmitting region BM_O of the black matrix 223. Accordingly, light can be incident on the third gate TFT G_TFT3, the sixth gate TFT G_TFT6, the seventh gate TFT G_TFT7, and the eighth gate TFT G_TFT8 of the Nth stage STn through the light transmitting region BM_O, thereby preventing the threshold voltage of the gate TFT from being shifted in the positive (+) direction. As a result, it is possible to prevent deterioration of the gate TFTs of the Nth stage STn due to the accumulated PBTS and to prevent deterioration in operational reliability, such as reduction in output current.

Figure 6:
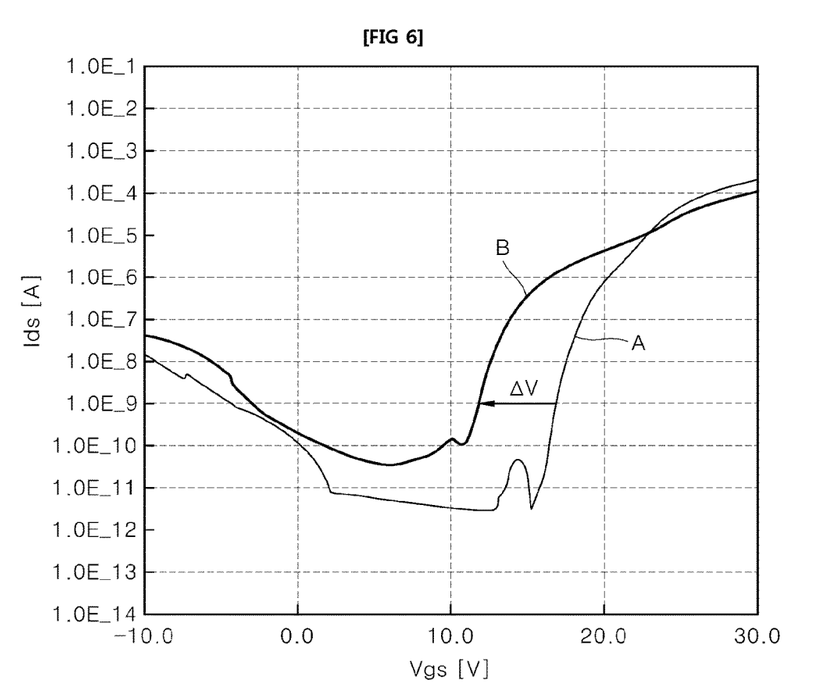
FIG. 6 is a graph showing voltage-current characteristics of a general gate TFT and a gate TFT according to an embodiment of the present invention.
Figure 7:
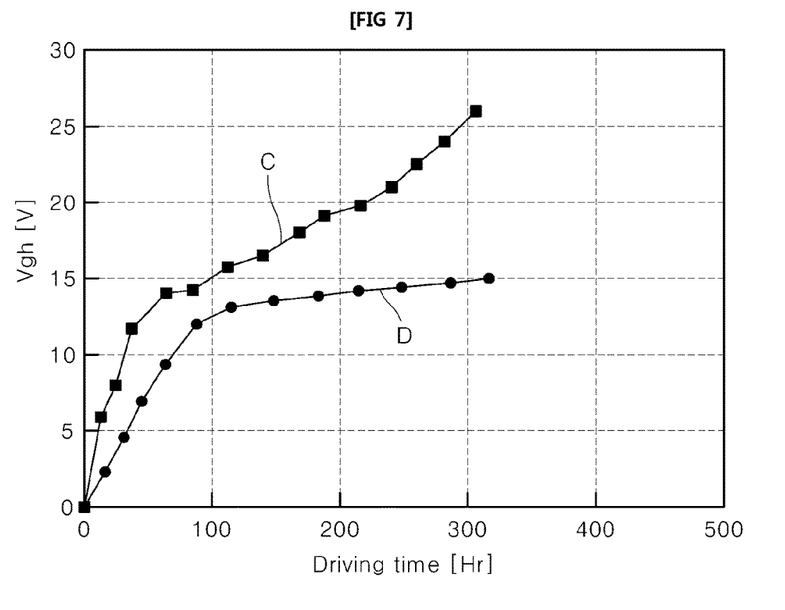
FIG. 7 is a graph showing threshold voltage characteristics of a general gate driver and a gate driver according to an embodiment of the present invention.

FIG. 6 is a graph showing voltage-current characteristics of a general gate TFT and the gate TFT according to an example of the present invention, and FIG. 7 is a graph showing threshold voltage characteristics of a general gate driver and the gate driver according to an example of the present invention.

Referring to FIG. 6, in a gate driver of the general display, the voltage-current characteristics of a gate TFT are shifted in the positive (+) direction due to the accumulated PBTS (see line A in FIG. 6).

In contrast, in the gate driver 120 of the display 100 according to this embodiment, light is allowed to be incident on at least one gate TFT of each of the stages and the voltage-current characteristics of the gate TFT are shifted in the negative (−) direction by a predetermined voltage (ΔV) (see line B in FIG. 6), as compared with those of the general gate TFT. Accordingly, the display 100 according to this embodiment can prevent deterioration of the gate TFT of the gate driver 120 and reduction in output current, thereby improving operational reliability.

Referring to FIG. 7, in a gate driver of the general display, threshold voltages of a plurality of gate TFTs are shifted in the positive (+) direction due to accumulated PBTS (see line C in FIG. 7). In comparison, in the gate driver 120 of the display 100 according to this embodiment, the threshold voltages of the plurality of gate TFTs can be kept constant (see line D in FIG. 7).

Although some embodiments have been described herein, it should be understood by those skilled in the art that these embodiments are given by way of illustration only and the present invention is not limited thereto. In addition, it should be understood that various modifications, variations, and alterations can be made by those skilled in the art without departing from the spirit and scope of the present invention. Therefore, the scope of the invention should be limited only by the accompanying claims and equivalents thereof.

What is claimed is:

1. A display panel, comprising:
   a first substrate comprising a display area in which a plurality of pixels is disposed and a non-display area outside the display area;
   a gate driver comprising a plurality of gate thin film transistors (TFTs) and disposed in the non-display area of the first substrate; and
   a second substrate comprising a black matrix corresponding to the gate driver, the black matrix comprising a light blocking region and a light transmitting region, the second substrate being coupled to the first substrate,
   wherein the light transmitting region of the black matrix overlaps with at least one gate TFT among the plurality of gate TFTs of the gate driver.

2. The display panel according to claim 1, wherein the display panel has a flip structure in which the first substrate is disposed under the second substrate.

3. The display panel according to claim 1, wherein the light transmitting region of the black matrix corresponds to an overall size of the at least one gate TFT.

4. The display panel according to claim 1, wherein the light transmitting region of the black matrix corresponds to a size of an active layer of the at least one gate TFT.

5. The display panel according to claim 4, wherein the active layer is formed of oxide.

6. The display panel according to claim 1, wherein the gate driver comprises a plurality of stages each comprising the plurality of gate TFTs, and the light transmitting region corresponds to at least one of the plurality of gate TFTs of each of the stages of the gate driver, the at least one gate TFT being operated according to potential of a QB node.

7. The display panel according to claim 1, wherein the at least one gate TFT receives light from an outside through a back surface of the second substrate and the light transmitting region of the black matrix.

8. The display panel according to claim 1, further comprising:
   a liquid crystal layer interposed between the first substrate and the second substrate,
   wherein the at least one gate TFT further comprises a common electrode forming an electric field together with a pixel electrode connected to a drain electrode to activate liquid crystal molecules of the liquid crystal layer.

9. A borderless type display, comprising:
   a display panel comprising:
     a first substrate comprising a display area in which a plurality of pixels are arranged and a non-display area outside the display area,
     a gate driver disposed in the non-display area of the first substrate and comprising a plurality of gate thin film transistors (TFTs), and
     a second substrate coupled to the first substrate and comprising a black matrix, the black matrix corresponding to the gate driver and comprising a light blocking region and a light transmitting region, the light transmitting region of the black matrix corresponding to at least one gate TFT among the plurality of gate TFTs of the gate driver; and
   a backlight unit disposed on a back surface of the second substrate and supplying light,
   wherein the at least one gate TFT of the gate driver receives light from the backlight unit through the light transmitting region of the black matrix of the second substrate.

10. The borderless type display according to claim 9, wherein the display panel has a flip structure in which the first substrate is disposed under the second substrate.

11. The borderless type display according to claim 9, wherein each of the plurality of gate TFTs of the gate driver comprises an active layer formed of oxide.

12. The display panel according to claim 5, wherein the light transmitting region is an opening in the black matrix configured to allow light traveling through the second substrate to be incident on the oxide of the active layer.

13. The display panel according to claim 12, wherein the oxide of the active layer has light-induced negative bias stress and is configured to shift a threshold voltage of the at least one gate TFT in a negative voltage direction in response to receiving the light on the oxide of the active layer through the opening in the black matrix.

14. The display panel according to claim 1, wherein the light transmitting region of the black matrix overlaps with an active layer of the at least one gate TFT.

15. The display panel according to claim 1, wherein a width of the light transmitting region of the black matrix is greater than a width of the active layer of the at least one gate TFT.

16. The borderless type display according to claim 9, wherein the light transmitting region is a hole in the black matrix, and
   wherein the hole overlaps with the at least one gate TFT of the gate driver.

17. The borderless type display according to claim 16, wherein a width of the hole in the black matrix is greater than a width of an active layer of the at least one gate TFT.

18. The borderless type display according to claim 9, wherein an active layer of the at least one gate TFT includes an oxide, and
   wherein the light transmitting region is configured to allow the light to travel through the second substrate and be incident on the oxide of the active layer.

19. The borderless type display according to claim 18, wherein the oxide of the active layer has light-induced negative bias stress and is configured to shift a threshold voltage of the at least one gate TFT in a negative voltage direction in response to receiving the light on the oxide of the active layer through the light transmitting region of the black matrix.

* * * * *